United States Patent
Huang et al.

(10) Patent No.: US 8,546,962 B2
(45) Date of Patent: Oct. 1, 2013

(54) MARK STRUCTURE AND METHOD FOR MEASURING ALIGNMENT ACCURACY BETWEEN FORMER LAYER AND LATTER LAYER

(75) Inventors: Jun-Chi Huang, Taichung County (TW); Po-Chao Tsao, Tainan (TW); Ming-Te Wei, Changhua County (TW)

(73) Assignee: United Microelectronics Corp., Hsinchu (TW)

( * ) Notice: Subject to any disclaimer, the term of this patent is extended or adjusted under 35 U.S.C. 154(b) by 395 days.

(21) Appl. No.: 13/042,721

(22) Filed: Mar. 8, 2011

(65) Prior Publication Data

US 2012/0229807 A1  Sep. 13, 2012

(51) Int. Cl.
*H01L 23/544* (2006.01)
*G01B 15/00* (2006.01)
*H01J 37/00* (2006.01)
*G01N 23/225* (2006.01)

(52) U.S. Cl.
USPC .................. 257/797; 257/773; 257/E23.179; 250/306; 250/310; 356/401

(58) Field of Classification Search
USPC ................. 257/797, 773, E23.179; 250/306, 250/310; 356/401
See application file for complete search history.

(56) References Cited

U.S. PATENT DOCUMENTS

| | | | |
|---|---|---|---|
| 7,351,969 B2 * | 4/2008 | Watanabe et al. | 250/310 |
| 7,569,838 B2 * | 8/2009 | Watanabe et al. | 250/428 |
| 2012/0235036 A1 * | 9/2012 | Hatakeyama et al. | 250/310 |

* cited by examiner

*Primary Examiner* — Nikita Wells
(74) *Attorney, Agent, or Firm* — J.C. Patents

(57) ABSTRACT

A mark structure for measuring the alignment accuracy between a former layer and a latter layer with electron beam inspection (EBI) is described. The mark structure includes multiple divisions, each of which includes at least one region that includes multiple parts each disposed with a pair of a pattern of the former layer and a pattern of the latter layer. In each region, all of the parts have the same distance in a direction between the pattern of the former layer and the pattern of the latter layer. The distance in the direction is varied over the regions of the divisions of the mark structure.

20 Claims, 2 Drawing Sheets

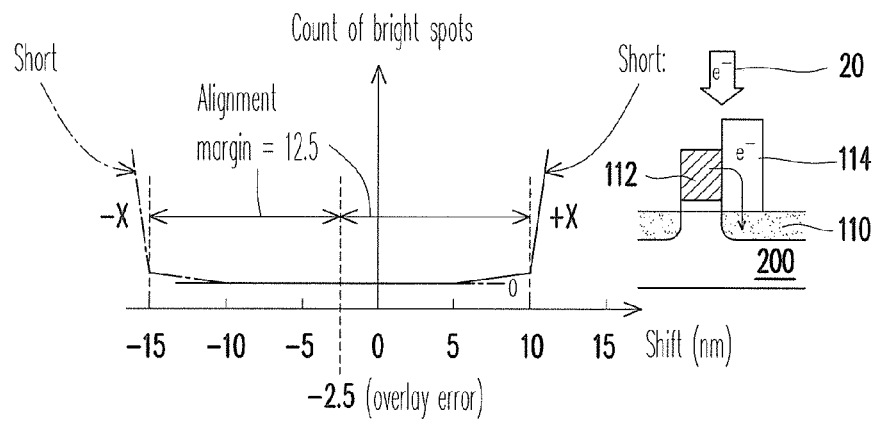
FIG. 2
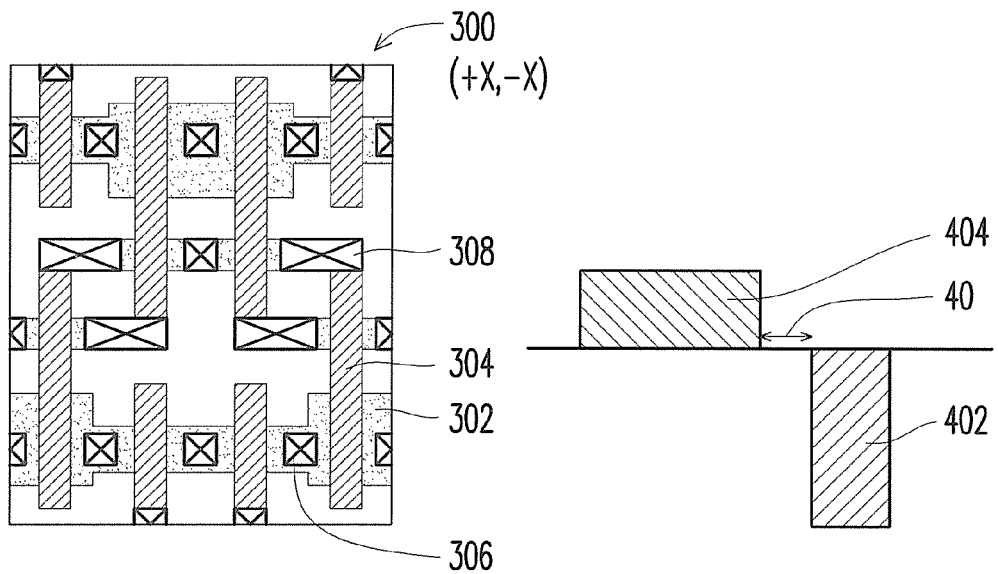
FIG. 3
FIG. 4
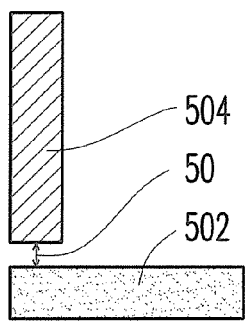
FIG. 5
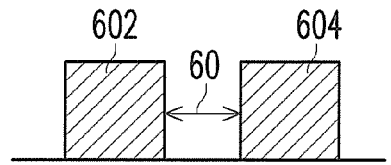
FIG. 6

MARK STRUCTURE AND METHOD FOR MEASURING ALIGNMENT ACCURACY BETWEEN FORMER LAYER AND LATTER LAYER

BACKGROUND OF THE INVENTION

1. Field of Invention

This invention relates to a mark structure for measuring the alignment accuracy between a former layer and a latter layer with electron beam inspection (EBI), and to a method for measuring the alignment accuracy between a former layer and a latter layer using the mark structure and an electron beam.

2. Description of Related Art

Conventionally, the alignment accuracy (AA) between photo layers is measured using box-in-box (BIB) AA verniers, or testkeys that require an electrical test for the measurement. However, an AA vernier takes a large area of about 40×40=1600 μm$^2$, and a testkey also takes such a large area due to the requirement of large test pads for the probing in the wafer acceptance test (WAT). Hence, the AA vernier or testkey can be formed in the scribe line regions only but cannot be embedded in the product, so that the AA window derived therefrom is not so accurate.

Moreover, the pattern of the AA vernier cannot be the same as that of the product so that the alignment accuracy derived therefrom is even less correct than that derived from the testkey. In addition, the alignment margin cannot be derived using an AA vernier. On the other hand, as a part of the WAT, the electrical test done to the testkeys for the measurement of the alignment accuracy takes much time so that the throughput is adversely affected.

SUMMARY OF THE INVENTION

In view of the foregoing, this invention provides a mark structure for measuring the alignment accuracy between a former layer and a latter layer with electron beam inspection (EBI), which takes a much smaller area than the conventional AA vernier or testkey to be suitably embedded in the product to derive a more correct AA window, and takes less time in the measurement than the testkey.

This invention also provides a method for measuring the alignment accuracy between a former layer and a latter layer using the mark structure of this invention and an electron beam.

The mark structure of this invention includes a plurality of divisions, each of which includes a first region that includes a plurality of parts each disposed with a pair of a pattern of the former layer and a pattern of the latter layer. In each first region, all the parts have the same distance in a first direction between the pattern of the former layer and the pattern of the latter layer. The distance in the first direction is varied over the first regions of the divisions. The first direction may be the X- or Y-direction.

The method for measuring alignment accuracy using the above mark structure of this invention is described below. The respective divisions of the mark structure are irradiated by an electron beam (E-beam). For each first region, the number of bright spots under the electron beam is counted. A curve of variation of the count of bright spots with the shift distance in the first regions is derived. The marginal distance under which the count of bright spots abruptly increases is determined from the curve, and is compared with a known alignment margin to derive an overlay error.

In an embodiment where the alignment margin in the first direction is also to be derived, each division of the mark structure may further include a second region that also includes a plurality of parts each disposed with a pair of a pattern of the former layer and a pattern of the latter layer. In each part of the first region in a division, the pattern of the latter layer is shifted from a first standard position by a shift distance in the positive aspect of the first direction, and in each part of the second region in the division, the pattern of the latter layer is shifted from the first standard position by the shift distance in the negative aspect of the first direction.

In the method for measuring alignment accuracy using the mark structure of the above embodiment, the number of bright spots is counted for each of the first regions and the second regions. A first curve of variation of the count of bright spots with the shift distance in the first regions is derived. A second curve of variation of the count of bright spots with the shift distance in the second regions is derived. For the first regions, a first marginal distance above which the count of bright spots abruptly increases is determined from the first curve. For the second regions, a second marginal distance below which the count of bright spots abruptly increases is determined from the second curve. The overlay error in the first direction as the midpoint of the first marginal distance and the second marginal distance is calculated, so is the alignment margin in the first direction as the difference between the midpoint and the first or second marginal distance.

In an embodiment where the alignment margins and the overlay errors in two directions, such as X-direction and Y-direction, are to be derived, each division of the mark structure may further include a third region and a fourth region each of which also includes a plurality of parts each disposed with a pair of a pattern of the former layer and a pattern of the latter layer. In each part of the third region in a division, the pattern of the latter layer is shifted from a second standard position by the shift distance in the positive aspect of the second direction, and in each part of the fourth region in the division, the pattern of the latter layer is shifted from the second standard position by the shift distance in the negative aspect of the second direction.

The overlay error and alignment margin in the second direction can be derived from the third regions and the fourth regions of the divisions under an electron beam, as in the derivation of the overlay error and alignment margin in the first direction.

In order to make the aforementioned and other objects, features and advantages of the present invention comprehensible, a preferred embodiment accompanied with figures is described in detail below.

BRIEF DESCRIPTION OF THE DRAWINGS

FIG. 2 illustrates a method for measuring the alignment accuracy using the mark structure shown in FIG. 1 according to an embodiment of this invention.

FIG. 3 illustrates a local top view of a mark structure for an SRAM fabricating process according to another embodiment of this invention.

FIG. 4 illustrates, in a cross-sectional view, another exemplary process to which the mark structure is suitably applied.

FIG. 5 illustrates, in a top view, still another exemplary process to which the mark structure is suitably applied.

FIG. 6 illustrates, in a cross-sectional view, yet another exemplary process to which the mark structure of this invention is suitably applied.

DESCRIPTION OF EMBODIMENTS

Figure 1:
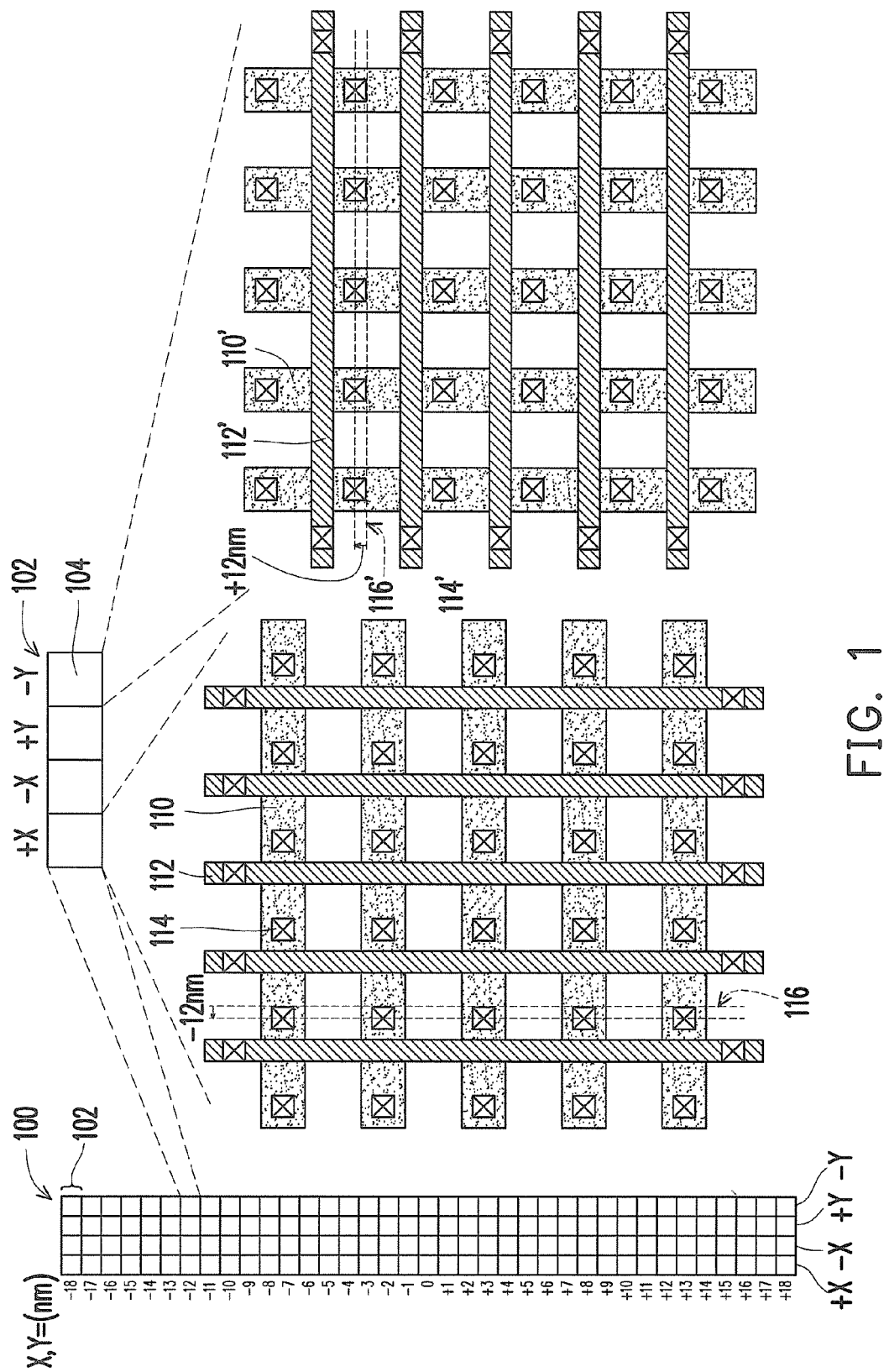
FIG. 1 illustrates a top view of a mark structure for measuring the alignment accuracy according to an embodiment of this invention.

FIG. 1 illustrates a top view of a mark structure for measuring alignment accuracy according to an embodiment of this invention.

Referring to FIG. 1, the mark structure 100 includes a plurality of divisions 102 different from each other in the shift distance. In this embodiment, the divisions 102 are arranged in the numeric order of the shift distance from −18 nm to +18 nm mainly for the convenience of the EBI. However, in other embodiment, the divisions may be randomly arranged if only the value of the shift distance of each division is known.

In this embodiment, each division 102 includes four regions 104 different from each other in the direction of the shift distance. The four regions 104 may include a +X region, a −X region, a +Y region and a −Y region in which the shift distances are in the +X direction, the −X direction, the +Y direction and the −Y direction, respectively.

The above mark structure 100 where each division 102 includes four regions 104 including a +X region, a −X region, a +Y region and a −Y region can be used to derive the alignment margins and the overlay errors in both the X-direction and the Y-direction.

However, in an embodiment where the alignment margin in one direction has been known and only the overlay error in the one direction is to be measured, each division may include only one of a +X region, a −X region, a +Y region and a −Y region. In an embodiment where only the alignment margin and the overlay error in the X-direction or Y-direction are to be measured, each division of the mark structure may include only a +X region and a −X region, or include only a +Y region and a −Y region.

The patterns in each of the four regions 104 is described with the +X region and the −Y region in the division of "X, Y=−12 nm" as an example. Each of the regions 104 includes a plurality of linear doped regions 110 in the substrate, a plurality of gate lines 112 perpendicular to and crossing over the doped regions 110, and a plurality of contact plugs 114 on the portions of the doped regions 110 divided by the gate line 112. In this embodiment, there are five linear doped regions 110 and five gate lines 112 in each region 104, so that 5×5 parts each including a pair of a pattern of the layer of the gate lines 112 as the former layer and a pattern of the layer of the contact plugs 114 as the latter layer are present in each region 104.

In the +X region or the −X region of a division 102 with a shift distance, the linear doped regions 110 are oriented in the X-direction, the gate lines 112 are oriented in the Y-direction, and each of the contact plugs 114 is shifted in the positive or negative aspect of the X-direction, from a standard position 116 at the midline of two adjacent gate lines 112, by a distance of (+1)×(the shift distance) or (−1)×(the shift distance). For example, in the division 102 with a shift distance of −12 nm, each contact plug 114 in the +X region is shifted by −12 [=(+1)×(−12)] nm, and each contact plug 114 in the −X region is shifted by +12 [=(−1)×(−12)]

In the +Y or −Y region of a division 102 with a shift distance, the linear doped regions 110' are oriented in the Y-direction, the gate lines 112' are oriented in the X-direction, and each of the contact plugs 114' is shifted in the positive or negative aspect of the Y-direction, from a standard position 116' at the midline of two adjacent gate lines 112', by a distance of (+1)×(the shift distance) or (−1)×(the shift distance). For example, in the division 102 with a shift distance of −12 nm, each contact plug 114 in the −Y region is shifted by +12 [=(−1)×(−12)] nm and each plug 114 in the +Y region shifted by −12 [=(+1)×(−12)] nm.

In this embodiment, the area of the mark structure 100 with 37 divisions 102 and 37×4 regions 104 is, for example, 36.844×5.788=213.2 µm², which is much smaller than that (~1600 µm²) of the AA vernier or the testkey in the prior art. Therefore, the mark structure 100 can be easily put in the product to be monitored to measure the alignment accuracy more correctly. In other embodiments, the mark structure of this invention can have less divisions and a smaller area if the shift distance is increased/decreased by more than 1 nm in one step and a less precise alignment accuracy is to be measured, or have more divisions and a larger area if the shift distance is increased/decreased by less than 1 nm in one step and a more precise alignment accuracy is to be measured.

FIG. 2 illustrates a method for measuring alignment accuracy using the mark structure shown in FIG. 1 according to an embodiment of this invention, wherein only the derivation of the overlay error and the alignment margin in the X-direction is illustrated as an example, based on which the derivation of the overlay error and the alignment margin in the Y-direction can be readily understood.

Referring to FIG. 2, an E-beam 20 is provided to irradiate the respective regions 104 each including the doped regions 110 in a well 200, and the gate lines 112 and the contact plugs 114 over the well 200. For each +X region in the divisions 102, the number of the bright spots is counted. A curve of the variation of the number of bright spots with the shift distance (−18 nm to +18 nm) is plotted for the +X regions of all the divisions 102. The curve shape of the curve for the +X regions is explained below.

When a contact plug 114 is at the standard position in the +X direction or is shifted to a position between the standard position and a certain position sufficiently distant from the adjacent gate line 112, no current flows from the adjacent gate line 112 to the doped region 110 and the well 200 through the contact plug 114, so that no bright spot is formed around the gate line-contact plug pair 112/114 under the E-beam 20. When the contact plug 114 is shifted close enough to the adjacent gate line 112, a small number of bright spots are present possibly due to some defects. When the contact plug 114 is shifted sufficiently to be in contact or short with the adjacent gate line 112, a current flows from the adjacent gate line 112 to the doped region 110 and the well 200 through the contact plug 114 for all the pairs 112/114, so that the number of bright spots abruptly increases. The symmetric curve shape of the second variation of the number of bright spots with the shift distance for the −X regions is caused in a similar way.

The derivation of the overlay error and the alignment margin in the X-direction is described below. In the example illustrated in FIG. 2, the number of bright spots abruptly increases when the shift distance is above 10 nm in the +X curve, and the number of bright spots abruptly increases when the shift distance is below −15 nm. Thus, the first marginal distance for the +X regions is 10 nm and the second marginal distance for the −X regions is −15 nm. The overlay error in X-direction is calculated as the midpoint of the first marginal distance and second marginal distance, being −2.5 nm. The alignment margin in X-direction is calculated as the difference between the above midpoint and the first or second marginal distance, being 12.5 nm.

The overlay error and the alignment margin in the Y-direction can be derived from the +Y curve and the −Y curve in a similar way. Thus, the overlay errors and the alignment margins in both the X-direction and the Y-direction are derived.

According to the above mentioned, if the alignment margin in the X-direction has been known, only one of the +X curve and the −X curve is required to derive the overlay error in the X-direction. That is, only the +X regions or the −X regions are required in the mark structure for deriving the overlay error in the X-direction. If the alignment margin in the Y-direction has also been known and only +Y regions or −Y regions are present in the mark structure for deriving the overlay error in the Y-direction, the width or area of the mark structure can be reduced by one half.

In addition, it is possible that the doped regions 110 and the well 200 have the same conductivity type, so that a pair 112/114 is either fully dark or fully bright under the E-beam facilitating the detection. The conductivity type can be P-type or N-type, and the dopant concentration of the doped regions 110 is higher than that of the well 200. For example, the doped regions 110 are $P^+$-doped and the well 200 is P-doped, or the doped regions 110 are $N^+$-doped and the well 200 is N-doped.

Further, it is possible to have the layout of the mark structure of this invention be similar to that of the product to be monitored with the mark structure. FIG. 3 illustrates a local top view of such a mark structure for an SRAM fabricating process according to another embodiment of this invention.

Referring to FIG. 3, the mark structure has the same layout as an SRAM device of which the fabricating process is to be monitored by the mark structure, including doped regions 302, gate lines 304, contact plugs 306 on the doped regions 302 between the gate lines 304, and share contacts 308 each connecting a gate line 304 and a doped region 302. By referring to the above descriptions and FIG. 1, the entire mark structure of this embodiment can be readily derived from FIG. 3 by duplicating a plurality of divisions having a similar layout and changing the distance between a contact plug 306 and an adjacent portion of a gate line 304 for different divisions, where the combination of a portion of a gate line 304 and a contact plug 306 corresponds to a pair of a pattern of the former layer (304) and a pattern of the latter layer (306+308) mentioned above.

Moreover, since there are five kinds of contacts, i.e., Vcc contacts, Vss contacts, bit-line (BL) contacts and node contacts all referred to by "306" and the share contacts 308 as shown in FIG. 3, in an SRAM, it is also possible to measure the overlay error and alignment margin between each kind of contact and the gate lines. For each kind of contact, e.g., the share contacts 308, an entire mark structure as shown in FIG. 1, or a reduced version thereof where only +X or −X regions are formed for the X-directional measurements and/or only +Y or −Y regions formed for the Y-directional measurements, is require.

Though the mark structure in the above embodiment is for measuring the overlay error and alignment margin between the gate lines and the contact plugs in an SRAM process, the applications of the mark structure of this invention is not limited thereto.

For example, FIG. 4 illustrates, in a cross-sectional view, another exemplary process to which the mark structure of this invention is suitably applied. The former layer 402 may include a polysilicon layer or a metal layer. The latter layer 404 may be include a metal layer, with a alignment margin 40 with respect to the former layer 402. The exemplary process may be a front-end process or a back-end process.

FIG. 5 illustrates, in a top view, still another exemplary process to which the mark structure of this invention is suitably applied. The former layer 502 includes a diffusion layer in a substrate or well. The latter layer 504 includes a poly-Si layer, with an alignment margin 50 with respect to the former layer 502. Such exemplary process is a front-end process.

FIG. 6 illustrates, in a cross-sectional view, yet another exemplary process to which the mark structure of this invention is suitably applied. The former layer 602 and the latter layer 604 both are patterned from the same conductive layer, but they are defined by two exposure steps respectively and have an alignment margin 60 between them. The conductive layer may be a poly-Si layer or a metal layer. Such exemplary process may be a front-end process or a back-end process.

Since the mark structure of this invention has an area much smaller than that of the conventional AA vernier or testkey, it can be easily embedded in the product to measure the alignment accuracy a more correctly. Moreover, the mark structure of this invention can be defined to be similar to the structure of the product to be monitored, so that the alignment accuracy can be measured even more correctly.

In addition, the E-beam inspection with counting of bright spots in the alignment accuracy measuring method of this invention takes less time as compared to the electrical test to the testkey in the WAT, so that the throughput is improved as compared to a case where testkeys are used to measure the overlay error and the alignment margin.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A mark structure for measuring alignment accuracy between a former layer and a latter layer with electron beam inspection (EBI), comprising:
   a plurality of divisions, each of which comprises a first region that comprises a plurality of parts each disposed with a pair of a pattern of the former layer and a pattern of the latter layer, wherein
   in each first region, all the parts have the same distance in a first direction between the pattern of the former layer and the pattern of the latter layer, and
   the distance in the first direction is varied over the first regions of the divisions.

2. The mark structure of claim 1, wherein the divisions are arranged in a numeric order of the distance in the first direction.

3. The mark structure of claim 1, wherein the first direction is X- or Y-direction.

4. The mark structure of claim 1, wherein in each first region, the patterns of the former layer and the patterns of the latter layer are arranged as in a product that is to be monitored using the mark structure.

5. The mark structure of claim 1, wherein the former layer comprises a layer of gates and the latter layer comprises a layer of contact plugs.

6. The mark structure of claim 5, wherein the contact plugs in the mark structure are disposed on a plurality of doped regions in a well of the same conductivity type.

7. The mark structure of claim 6, wherein the conductivity type is P- or N-type.

8. The mark structure of claim 1, wherein the former layer comprises a diffusion layer, and the latter layer comprises a polysilicon layer.

9. The mark structure of claim 1, wherein the former layer comprises a polysilicon layer or a metal layer, and the latter layer comprises a metal layer.

10. The mark structure of claim 1, wherein
each division further comprises a second region that also comprises a plurality of parts each disposed with a pair of a pattern of the former layer and a pattern of the latter layer, and
in each part of the first region in a division, the pattern of the latter layer is shifted from a first standard position by a shift distance in a positive aspect of the first direction, and in each part of the second region in the division, the pattern of the latter layer is shifted from the first standard position by the shift distance in a negative aspect of the first direction.

11. The mark structure of claim 10, wherein the divisions are arranged in a numeric order of the shift distances in the first and second regions of the divisions.

12. The mark structure of claim 10, wherein
each division further comprises a third region and a fourth region each of which also comprises a plurality of parts each disposed with a pair of a pattern of the former layer and a pattern of the latter layer, and
in each part of the third region in a division, the pattern of the latter layer is shifted from a second standard position by the shift distance in a positive aspect of a second direction, and in each part of the fourth region in the division, the pattern of the latter layer is shifted from the second standard position by the shift distance in a negative aspect of the second direction.

13. The mark structure of claim 12, wherein the divisions are arranged in a numeric order of the shift distances in the first to fourth regions of the divisions.

14. The mark structure of claim 12, wherein the first direction is X-direction and the second direction is Y-direction.

15. A method for measuring alignment accuracy between a former layer and a latter layer with electron beam inspection (EBI), comprising:
providing a mark structure of claim 1;
irradiating respective divisions of the mark structure by an electron beam;
counting, for each first region, a number of bright spots under the electron beam;
deriving a curve of variation of the count of bright spots with the shift distance for the first regions,
determining, from the curve, a marginal distance in the first direction below which the count of bright spots abruptly increases; and
comparing the determined marginal distance to a known alignment margin to derive an overlay error.

16. The method of claim 15, wherein the first direction is X- or Y-direction.

17. A method for measuring alignment accuracy between a former layer and a latter layer with electron beam inspection, comprising:
providing a mark structure of claim 10;
irradiating respective divisions of the mark structure by an electron beam;
counting, for each of the first regions and the second regions, a number of bright spots under the electron beam;
deriving a first curve of variation of the count of bright spots with the shift distance in the first regions, and a second curve of variation of the count of bright spots with the shift distance in the second regions;
determining, from the first curve, a first marginal distance above which the count of bright spots abruptly increases in the first regions;
determining, from the second curve, a second marginal distance below which the count of bright spots abruptly increases in the second regions; and
calculating an overlay error in the first direction as a midpoint of the first marginal distance and the second marginal distance, and an alignment margin in the first direction as a difference between the midpoint and the first or second marginal distance.

18. The method of claim 17, wherein the first direction is X- or Y-direction.

19. A method for measuring alignment accuracy between a former layer and a latter layer with electron beam inspection, comprising:
providing a mark structure of claim 12;
irradiating respective divisions of the mark structure by an electron beam;
counting, for each of the first regions, the second regions, the third regions and the fourth regions, a number of bright spots under the electron beam;
deriving a first curve of variation of the count of bright spots with the shift distance in the first regions, a second curve of variation of the count of bright spots with the shift distance in the second regions, a third curve of variation of the count of bright spots with the shift distance in the third regions, and a fourth curve of variation of the count of bright spots with the shift distance in the fourth regions;
determining, from the first curve, a first marginal distance above which the count of bright spots abruptly increases in the first regions;
determining, from the second curve, a second marginal distance below which the count of bright spots abruptly increases in the second regions;
determining, from the third curve, a third marginal distance above which the count of bright spots abruptly increases in the third regions;
determining, from the fourth curve, a fourth marginal distance below which the count of bright spots abruptly increases in the fourth regions; and
calculating a first overlay error in the first direction as a first midpoint of the first marginal distance and the second marginal distance, a first alignment margin in the first direction as a difference between the first midpoint and the first or second marginal distance, a second overlay error in the second direction as a second midpoint of the third marginal distance and the fourth marginal distance, and a second alignment margin in the second direction as a difference between the second midpoint and the third or fourth marginal distance.

20. The method of claim 19, wherein the first direction is X-direction and the second direction is Y-direction.

* * * * *